United States Patent [19]
Toi

[11] Patent Number: 5,086,556
[45] Date of Patent: Feb. 11, 1992

[54] ELECTRONIC COMPONENT MOUNTING APPARATUS

[75] Inventor: Hiroshi Toi, Kanagawa, Japan
[73] Assignee: Sony Corporation, Tokyo, Japan
[21] Appl. No.: 712,670
[22] Filed: Jun. 10, 1991

[30] Foreign Application Priority Data

Jun. 14, 1990 [JP] Japan ................. 2-153927

[51] Int. Cl.$^5$ ............................................. B23P 19/00
[52] U.S. Cl. .......................................... 29/740; 29/705; 29/720; 364/571.05; 901/46
[58] Field of Search ............... 29/740, 705, 714, 720, 29/743; 364/571.02, 571.05, 559, 561, 474.37; 901/46, 47

[56] References Cited

U.S. PATENT DOCUMENTS

| | | | |
|---|---|---|---|
| 3,906,325 | 9/1975 | Salmon | 901/46 |
| 4,498,778 | 2/1985 | White | 364/571.02 |
| 4,926,345 | 5/1990 | Novak et al. | 901/46 |
| 4,980,971 | 1/1991 | Bartschat et al. | 29/740 |
| 5,033,185 | 7/1991 | Hidese | 29/714 |

FOREIGN PATENT DOCUMENTS

251800 10/1989 Japan ........................ 29/740

*Primary Examiner*—P. W. Echols
*Attorney, Agent, or Firm*—Lewis H. Eslinger; Jay H. Maioli

[57] ABSTRACT

An electronic component mounting apparatus wherein any unflatness value such as skew at each of predetermined points on the surface of a substrate supported at a component mounting position is measured by a non-contact type measuring instrument. Such unflatness value and a predetermined height of each electronic component to be mounted are calculated, and the descent stroke of each suction nozzle is adjusted in accordance with the result of such calculation in such a manner that the bottom face of the component is set exactly at the predetermined position on the substrate surface, thereby ensuring accurate mounting of the component on the substrate surface without causing any impact thereto to consequently attain proper attachment.

2 Claims, 5 Drawing Sheets

F I G. 3A
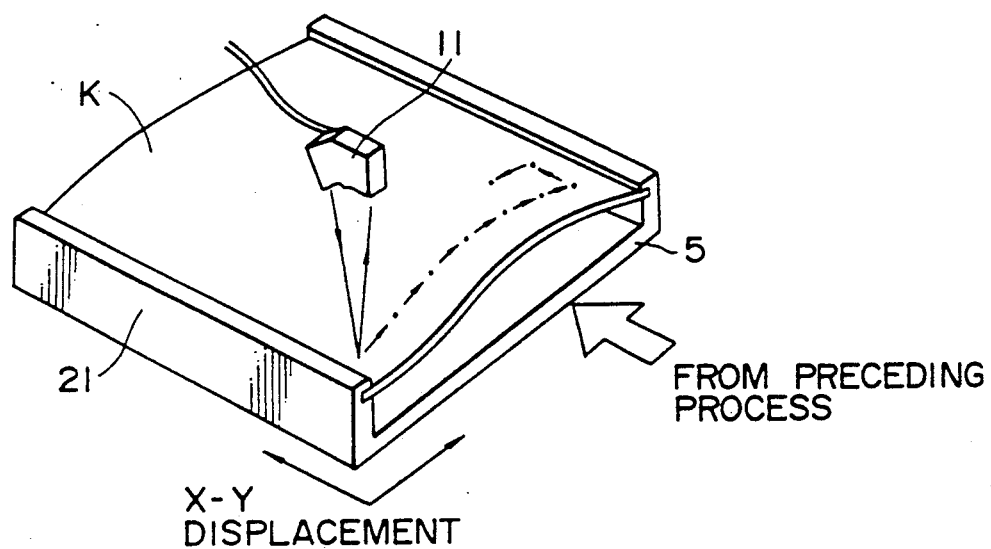
F I G. 3B
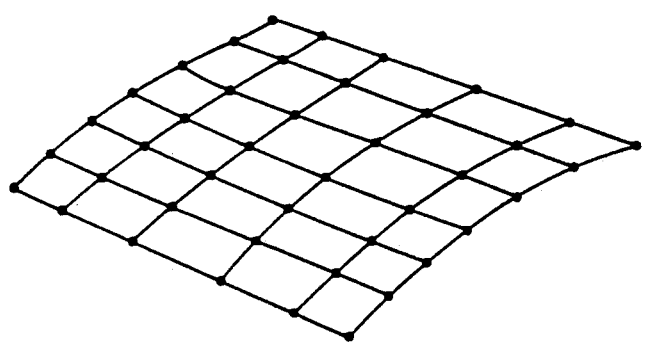

ELECTRONIC COMPONENT MOUNTING APPARATUS

BACKGROUND OF THE INVENTION

1. Field of the Invention

The present invention relates to an apparatus for mounting electronic components or the like on a substrate by means of suction nozzles and attaching the same exactly at proper positions without causing any load to the substrate or the electronic components either.

2. Description of the Prior Art

Relative to the conventional apparatus designed for automatically mounting electronic components on the surface of a circuit substrate or the like, there is known a type called a chip placer. Generally such chip placer picks up an electronic component fed from a parts cassette while sucking it by means of a suction nozzle and then mounts the same at a predetermined position on a circuit substrate.

If any skew or distortion is existent in the substrate for mounting electronic components, there arises a problem that each electronic component fails to be accurately mounted at a proper position on the substrate by the suction nozzle. Particularly in any of the latest products where the packaging density on the circuit substrate has been enhanced, it is a matter of importance to realize exact mounting of electronic components at accurate positions on the substrate.

In view of such circumstances, there is proposed a contrivance as illustrated in FIG. 6 for the purpose of precisely mounting electronic components on a substrate despite its skew or distortion, wherein a spring 51 is fitted into a fore end of a suction nozzle 50, and a component sucking portion 52 formed at the fore end is moved upward or downward in compliance with the skew of the substrate K to thereby absorb such skew, hence enabling proper attachment of the electronic component onto the substrate K.

However, according to the means mentioned above, the electronic component T to be mounted is pressed against the substrate K to be consequently affected by an excessive force. As a result, in case any great skew or the like is existent, some impact may be imparted to the electronic component to eventually cause crack or flaw in the component itself. And in a worse case, the substrate K may also be damaged.

Furthermore, in the mounting stage, there may arise another problem that the substrate K is vibrated to induce a positional error of each component already mounted.

One of the known means contrived for solving the above problems is such as shown in FIG. 7, wherein a substrate K supported in a substrate holder 60 is sucked by vacuum means in the holder 60 so that any skew or the like of the substrate K is corrected forcibly, and then an electronic component T is mounted on the surface of the substrate. According to this means, any skew or the like of the substrate K can be eliminated with certainty to achieve proper mounting of the electronic component at the accurate position on the substrate surface without giving any excessive load to the component.

In employment of such means, however, it is necessary to provide a suction jig 61 which conforms with the substrate K for attaining exact suction of the substrate K in the holder 60. Therefore a disadvantage is unavoidable with respect to both the general-purpose usability and the production cost, so that such means is not adoptable practically. In addition, some restriction is also non-negligible in designing the substrate K since a complicated structure thereof is not permitted due to the necessity of exact suction of the substrate K by the suction jig 61.

OBJECT AND SUMMARY OF THE INVENTION

It is therefore an object of the present invention to provide an improved apparatus for mounting each of electronic components on the surface of a substrate by first measuring any skew or the like of the substrate by the use of a non-contact type measuring instrument, then calculating the value of such skew and the height of the electronic component to be mounted, and controlling the descent stroke of a suction nozzle in such a manner that the bottom face of the component is set exactly at a predetermined position on the substrate surface, thereby ensuring accurate mounting of the component on the substrate surface without giving any impact thereto to consequently accomplish proper attachment.

According to one aspect of the present invention, there is provided an electronic component mounting apparatus which comprises component holding means for holding electronic components supplied from parts feeders and mounting the same sequentially on a print substrate; a means for positioning the substrate; a measuring means disposed on the positioned substrate for measuring the unflatness values of the substrate at predetermined surface positions thereof in a non-contact manner and producing output data representative of the measured unflatness values; and a means for adding each of the unflatness values of the substrate as a correction value to the descent stroke of the holding means. Due to such a structure, the descent stroke of the holding means can be corrected properly to achieve precise attachment of each electronic component.

The above and other features and advantages of the present invention will become apparent from the following description which will be given with reference to the illustrative accompanying drawings.

BRIEF DESCRIPTION OF THE DRAWINGS

FIG. 3A is a schematic perspective view illustrating how the skew of a substrate is measured by a non-contact type measuring instrument in the apparatus of FIG. 1;

FIG. 3B shows numerical control data obtained by such measurement;

DESCRIPTION OF THE PREFERRED EMBODIMENT

Hereinafter a preferred embodiment of the present invention will be described in detail with reference to the accompanying drawings.

Figure 1:
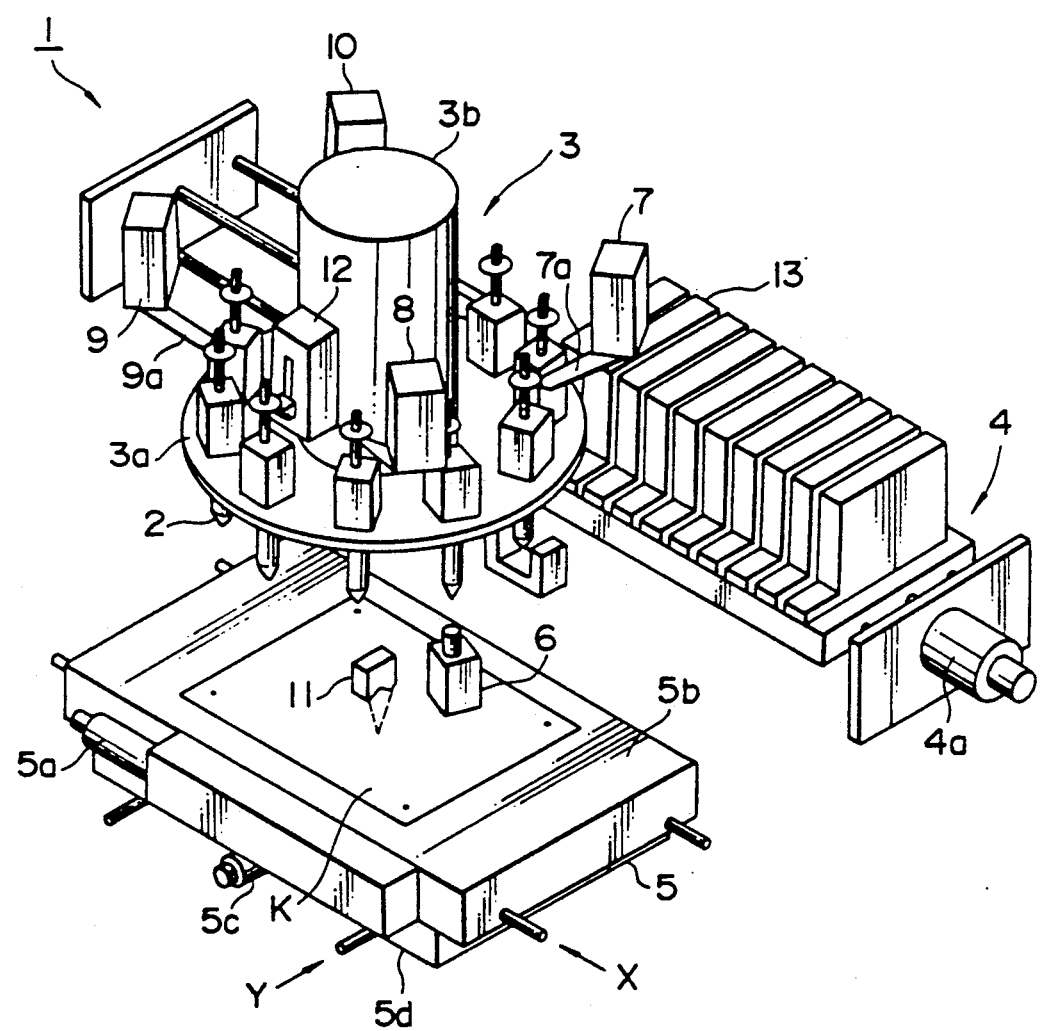
FIG. 1 is a perspective view of an electronic component mounting apparatus embodying the present invention.

FIG. 1 is a schematic perspective view of an electronic component mounting apparatus known generally as a chip placer to which the present invention is applied. In this diagram, the chip placer 1 comprises a rotary head 3 equipped with a plurality of suction nozzles 2; a component feeder 4 for feeding electronic components to the suction nozzles 2; an X-Y table 5 adapted to support a substrate K thereon fixedly and movable in mutually orthogonal X-axis and Y-axis directions for positioning its component mounting points with respect to the components being sucked by the nozzles; a video camera 6 for detecting the positional error of each sucked component before the suction nozzle 2 mounts each component; and four actuators 7, 8, 9 and 10 for rotating the suction nozzles 2 by predetermined angles at the respective fixed positions. A non-contact type sensor 11 for detecting the skew value of the substrate K is disposed above the X-Y table 5, and a nozzle stroke changing actuator 12 is also disposed above the table 5 for adjusting the Z-axis nozzle stroke of the suction nozzle 2 in accordance with the output signal of the sensor 11.

On the rotary head 3, a plurality of suction nozzles 2 are disposed at equal intervals along the periphery of a disc base $3a$ in a manner to be vertically movable, and the suction nozzles 2 are sequentially advanced stepwise by a base drive unit $3b$ toward a station which serves as a halt position for each nozzle 2.

The component feeder 4 is equipped with a plurality of parts cassettes 13 which contain taped electronic components therein and are assorted in conformity with the plurality of kinds of electronic components to be mounted. The feeder 4 is further equipped with a Z-axis DC servo motor $4a$ having an encoder so as to position a selected parts cassette 13 with respect to the station, where suction is performed by the rotary head 3, in such a manner that a desired electronic component can be supplied. The encoder of the DC servo motor $4a$ is used for positioning servo control.

In the X-Y table 5, a table $5b$ is positioned in the X-direction by an X-axis DC servo motor $5a$ while being positioned in the orthogonal Y-direction by a table $5d$ equipped with a Y-axis DC servo motor $5c$. The substrate K for mounting electronic components thereon is supported on the table $5b$ fixedly by an adequate means such as a substrate holder. And the position for mounting a desired component on the substrate K is moved by the X-Y table 5 to the station where the component is mounted by the rotary head 3.

Four actuators 7, 8, 9 and 10 are installed fixedly in conformity with predetermined stations of the rotary head 3. The $\theta$ rotation actuator 7 is disposed correspondingly to a station posterior to the sucking station and imparts a rotation of an angle $\theta$ to the suction nozzle 2 advanced to such station stepwise, so that the electronic component being sucked is mounted on the substrate K in a predetermined direction. The $\Delta\theta$ rotation actuator 8 is diposed correspondingly to a station anterior to the mounting station and posterior to the station where the video camera 6 detects the suction error. The actuator 8 rotates the suction nozzle by an angle $\Delta\theta$ equivalent to the error in the nozzle direction ($\theta$ direction) out of the detected suction errors of the component, thereby correcting the direction of the component. The $-(\theta + \Delta\theta)$ rotation actuator 9 is disposed correspondingly to a post-mounting station and serves to return the direction of the suction nozzle 2 to the original point (initial state). Meanwhile the suction direction setting actuator 10 is disposed correspondingly to a station posterior to the post-mounting station and anterior to the component suction. The actuator 10 serves to set the direction of the suction nozzle at the time of sucking an electronic component fed from a predetermined parts cassette 13. The above actuators 7 through 10 are equipped respectively with levers $7a$ through $10a$ (of which $10a$ is not shown) each having a rotation transmitting means at one end thereof and function to rotate the suction nozzles 2 in the individual stations while being kept in engagement with the rotary shafts of the nozzles 2.

A non-contact type sensor 11 is disposed above the X-Y table 5 to measure the unflatness or skew value of the substrate K. As illustrated in FIGS. 3A and 3B, the X-Y table 5 is displaced in the mutually orthogonal X-axis and Y-axis directions with respect to the sensor 11 so that the measurement can be achieved over the entire area of the substrate K. A detection signal outputted from the sensor 11 is supplied to a length measuring unit 14 and is stored as numerical control data in a memory, whereby the skew value of the substrate K in the Z-axis direction can be measured.

In accordance with the skew value of the substrate K measured by the sensor 11, the nozzle stroke changing actuator 12 corrects the displacement of the suction nozzle 2 in the Z-axis direction when an electronic component is mounted on the substrate K by the suction nozzle 2.

Figure 2:
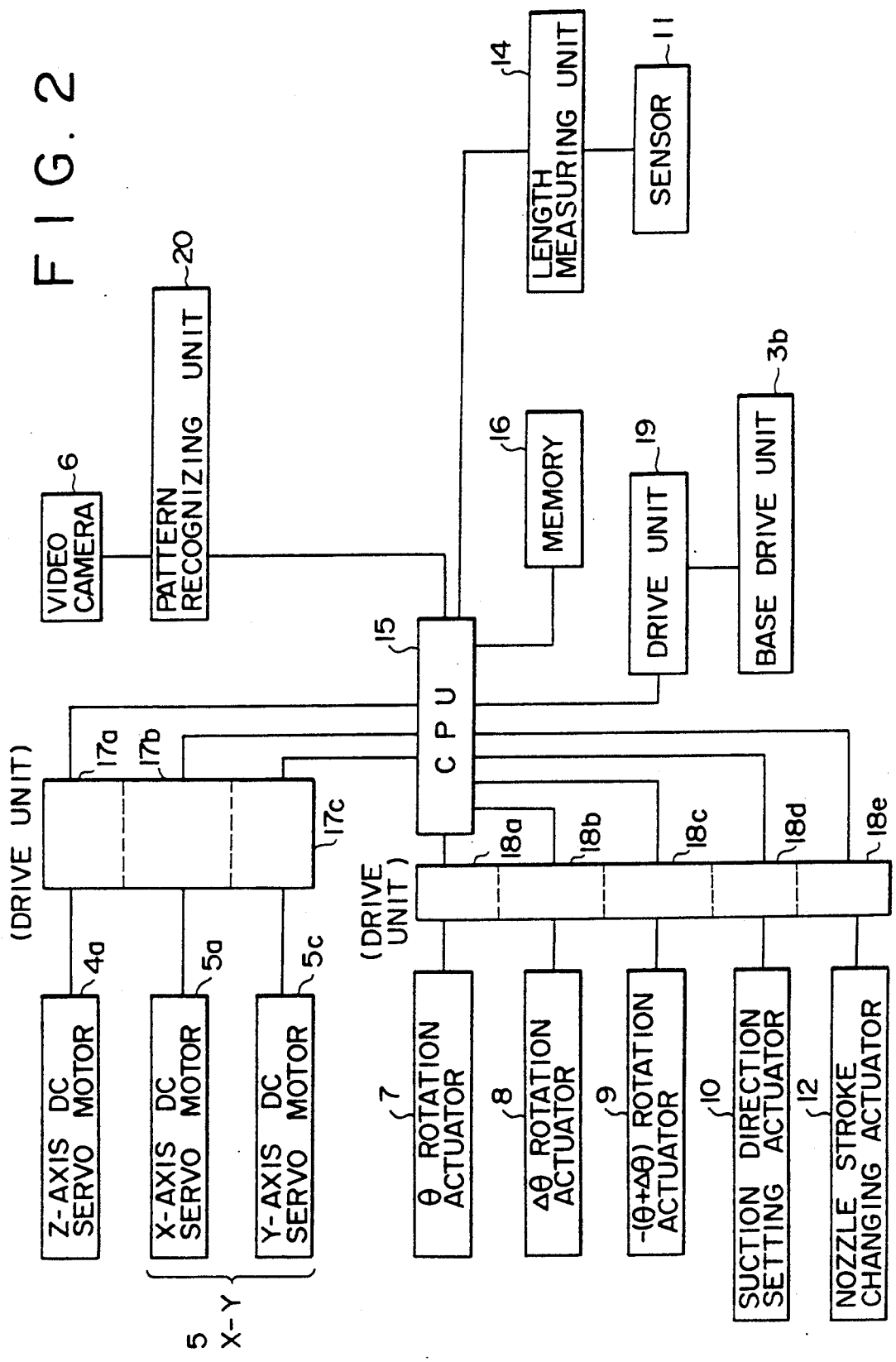
FIG. 2 is a block circuit diagram of a controller employed in the apparatus of FIG. 1.

FIG. 2 is a block diagram showing the circuit configuration of a controller employed in the chip placer 1.

The controller comprises a CPU (central processing unit) 15 for controlling drive units in the chip placer, and a memory 16 connected to the CPU 15 and storing both a program of the control procedure and data required for such control. In the memory 16, there are previously stored, with regard to individual electronic components to be sucked, the data representative of the directions and heights of the suction nozzles 2 in the stage of sucking electronic components by the suction direction setting actuator 14. The CPU 15 is connected to drive units $17a$, $17b$ and $17c$ which execute servo control of a Z-axis DC servo motor $4a$, an X-axis DC servo motor $5a$ and a Y-axis DC servo motor $5c$ respectively on the basis of the controlled variables obtained from the CPU 15. The CPU 15 is further connected to drive units $18a$, $18b$, $18c$, $18d$ and $18e$. Such drive units $18a$ through $18d$ control the rotation angles in accordance with the angle control values supplied from the CPU 15 respectively to the $\theta$ rotation actuator 7, the $\Delta\theta$ rotation actuator 8, the $-(\theta + \theta)$ rotation actuator 9, and the suction direction setting actuator 10. Meanwhile the drive unit $18e$ controls the vertical displacement of the suction nozzle 2 in accordance with the height control value supplied from the CPU 16 to the nozzle stroke changing actuator 12.

A drive unit 19 controls the stepping motion of the base drive unit $3b$ in response to an instruction from the CPU 15. A pattern recognizing unit 20 recognizes the pattern of the output video signal from the video camera 6 so as to detect the component suction errors of the suction nozzle 2, thereby detecting the errors (X', Y', $\Delta\theta$). The errors thus obtained are supplied to the CPU 15. Then the CPU 15 corrects the error $\Delta\theta$ by the $\Delta\theta$ rotation actuator 10, and further corrects the errors X' and Y' simultaneously with determination of the mounting position on the substrate.

Figure 4:
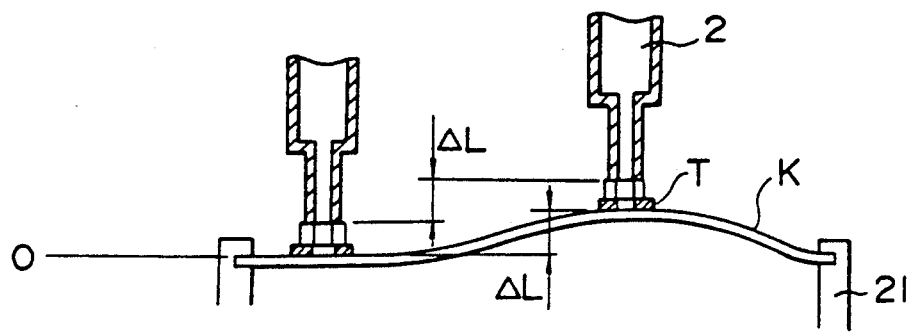
FIG. 4 is a sectional view of principal portions illustrating how electronic components are mounted on the substrate by suction nozzles in the apparatus.

Meanwhile the length measuring unit 14 detects the skew value ($\Delta L$) of the substrate K on the basis of the numerical control data obtained from the sensor 11 and transmits the detected value to the CPU 15. Then the CPU 15 calculates the skew value $\Delta L$ and the component mounting height programmed in advance, thereby determining the descent stroke of the suction nozzle 2. Subsequently the descent stroke of the suction nozzle 2 is corrected by the actuator 12 in such a manner that, as illustrated in FIG. 4, the bottom face of the electronic component to be mounted by the suction nozzle 2 is placed at a predetermined position on the substrate surface.

Figure 5:
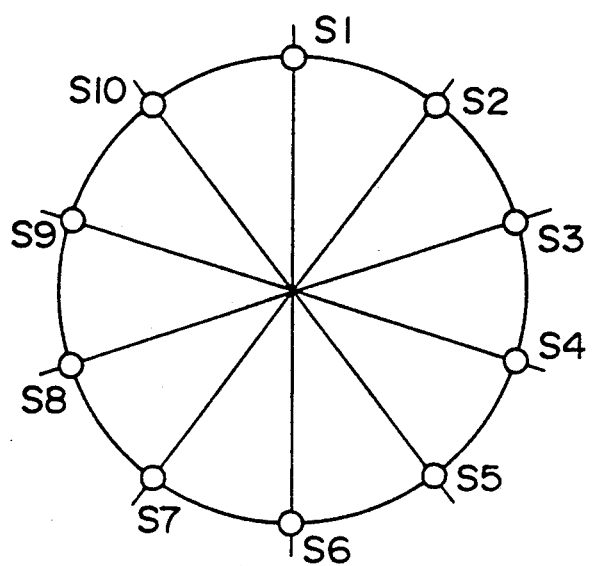
FIG. 5 is a plan view of stations for the suction nozzles.
Figure 6:
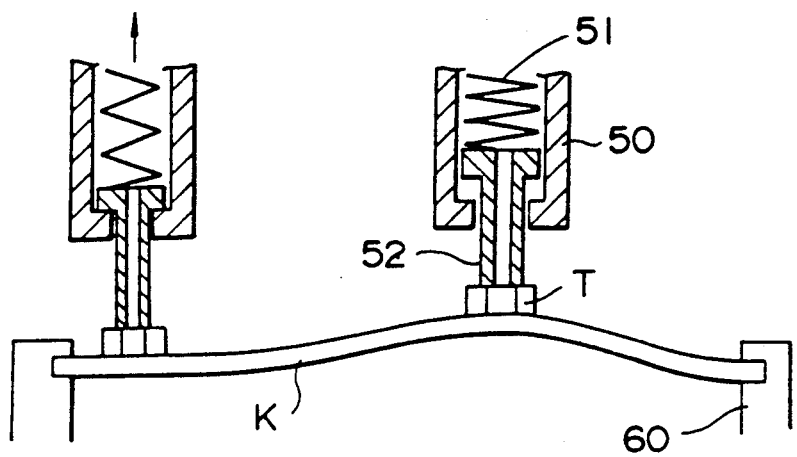
FIG. 6 is a sectional view of principal portions illustrating how electronic components are mounted on a substrate by suction nozzles in a convantional apparatus.
Figure 7:
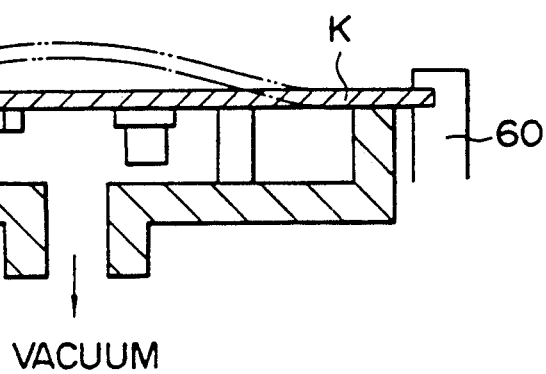
FIG. 7 is a sectional partial view of a conventional vacuum type substrate holder.

Referring now to the aforementioned stations, a description will be given below with regard to the component mounting process in this embodiment. FIG. 5 is a plan view of such stations. The stations S1 through S10 correspond, in both number and position, to the suction nozzles 2 of the rotary head 3. S10 (Measurement of skew value of substrate)

When the substrate K from the preceding process has reached the electronic component mounting position, the skew value of the substrate K supported in the substrate holder 21 is measured by the sensor 11. Then the X-Y table 5 is displaced, and the skew value $\Delta L$ at the programmed component mounting position on the substrate K is measured. The procedure may be so modified that the sensor 11 previously measures the positions over the entire area of the substrate surface. In such a case, the operation of measuring the skew value of the entire substrate may be performed merely once.

The information thus obtained in such measurement by the sensor 11 is converted into numerical control data by the length measuring unit 14 and then is stored in the memory 16.

S1 (Suction)

The electronic component set in the parts cassette 13 is sucked by the nozzle 2.

S3 ($\theta$ rotation)

In accordance with the prepared program inputted in advance, the suction nozzle 2 is so rotated that the electronic component T is mounted on the substrate K in the predetermined direction. Such rotation of the suction nozzle 2 is performed by the force imparted from the $\theta$ rotation actuator 7.

S4 (Camera)

The values (X', Y', $\theta$ directions) relative to the predetermined position of the component mounted by the nozzle 2 are detected by the video camera 6.

S5 ($\Delta\theta$ rotation)

The rotation error in the $\theta$ direction detected in the station S4 is corrected.

S6 (Mounting)

The X-Y table 5 is displaced in accordance with the prepared program in such a manner that the electronic component T being sucked by the nozzle 2 can be mounted exactly at the predetermined position on the substrate K. And then the component T is mounted thereat. In such mounting step, the measured skew value $\Delta L$ of the substrate K and the programmed mounting height of the component T are calculated to adjust the descent stroke of the suction nozzle 2 by the nozzle stroke changing actuator 12, whereby the bottom face of the component T is placed at the predetermined height or vertical position on the substrate surface. The positional errors of the component T in the X-Y directions detected in the station S4 are amended by correcting the halt position of the X-Y table 5 in the aforementioned displacement.

S7 ($-(\Delta+\theta)$ rotation)

The rotational direction of the suction nozzle is returned to the original point (initial state). S9 (Setting of sucking direction)

In accordance with the prepared program, the component sucking direction of the nozzle is set in conformity to each component to be sucked.

Thus, in the present invention where the descent stroke of the suction nozzle 2 is changed in compliance with the skew value of the substrate K, each electronic component T can be mounted accurately at the predetermined position on the substrate surface without exerting any harmful influence on the substrate K or the component T either.

As described hereinabove, according to the electronic component mounting apparatus of the present invention, any skew or unflatness value of a substrate held at a component mounting position is detected by a non-contact type measuring instrument, and then the skew value and the component mounting height are calculated to control the descent stroke of a suction nozzle in such a manner that the bottom face of each electronic component is set exactly at the predetermined position on the substrate surface, hence realizing accurate attachment of the electronic component onto the substrate surface by the suction nozzle. Consequently, in the operation of mounting the electronic component on the substrate, precise positioning can be achieved without causing any impact to the substrate or the electronic component either.

WHAT IS CLAIMED IS;

1. An electronic component mounting apparatus comprising:
    means for holding electronic components supplied from a component feeder and mounting the same sequentially on a substrate;
    a means for positioning the substrate;
    a measuring means disposed facing the positioned substrate for measuring the unflatness values of the substrate at predetermined surface points thereof in a non-contact manner and producing output data representative of the measured unflatness values; and
    a means for adding the unflatness values of the substrate as correction values to the descent strokes of said component holding means.

2. An electronic component mounting apparatus according to claim 1, further comprising:
    a means for storing the data representative of the heights of electronic components to be mounted; and
    a means for adding the data of the component heights as correction values to the descent strokes of said component holding means.

* * * * *